(12) United States Patent
Tanida et al.

(10) Patent No.: US 8,618,724 B2
(45) Date of Patent: Dec. 31, 2013

(54) REFLECTIVE FRAME FOR LIGHT-EMITTING ELEMENT, SUBSTRATE FOR LIGHT-EMITTING ELEMENT AND LIGHT-EMITTING DEVICE

(71) Applicant: Asahi Glass Company, Limited, Chiyoda-ku (JP)

(72) Inventors: Masamichi Tanida, Chiyoda-ku (JP); Akihiro Hishinuma, Chiyokda-ku (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 13/735,362

(22) Filed: Jan. 7, 2013

(65) Prior Publication Data
US 2013/0119852 A1    May 16, 2013

Related U.S. Application Data

(63) Continuation of application No. PCT/JP2011/065514, filed on Jul. 6, 2011.

(30) Foreign Application Priority Data

Jul. 7, 2010   (JP) .................................. 2010-154884

(51) Int. Cl.
*H01L 33/60* (2010.01)
*H01L 33/58* (2010.01)
*F21V 7/22* (2006.01)

(52) U.S. Cl.
USPC .............................................. 313/113; 257/98

(58) Field of Classification Search
USPC .......... 313/113; 257/98, 99–100; 362/296.01; 501/73
See application file for complete search history.

(56) References Cited

U.S. PATENT DOCUMENTS

| | | |
|---|---|---|
| 8,378,379 B2 | 2/2013 | Tanida et al. |
| 2011/0140154 A1* | 6/2011 | Nakayama et al. ............. 257/98 |
| 2011/0204398 A1* | 8/2011 | Tanida et al. ................... 257/98 |
| 2011/0241049 A1 | 10/2011 | Tanida et al. |

FOREIGN PATENT DOCUMENTS

| | | |
|---|---|---|
| JP | 2009-164311 | 7/2009 |
| WO | 2009/051178 | 4/2009 |
| WO | 2009/128354 | 10/2009 |

* cited by examiner

*Primary Examiner* — Karabi Guharay
(74) *Attorney, Agent, or Firm* — Oblon, Spivak, McClelland, Maier & Neustadt, L.L.P.

(57) ABSTRACT

To provide a reflective frame for a light-emitting element, which can be preferably used for a light-emitting device having a metal member on which a light-emitting element is mounted, whereby the light extraction efficiency, the reliability and the productivity, etc. can be improved. A reflective frame for a light-emitting element, which is made of a sintered body comprising a glass material and a ceramic powder; and the sintered body is one fired at at most 900° C. and has a porosity of at most 15% and an average reflectance at a wave length of from 400 to 700 nm being at least 86% when the thickness is 1 mm.

10 Claims, 2 Drawing Sheets

REFLECTIVE FRAME FOR LIGHT-EMITTING ELEMENT, SUBSTRATE FOR LIGHT-EMITTING ELEMENT AND LIGHT-EMITTING DEVICE This application is a continuation of PCT/JP2011/065514 filed Jul. 6, 2011 and claims the benefit of JP 2010-154884 filed Jul. 7, 2010.

TECHNICAL FIELD

The present invention relates to a reflective frame for a light-emitting element, a substrate for a light-emitting element and a light-emitting device, particularly to a reflective frame for a light-emitting element, which is used for a metal member on which a light-emitting element is mounted, a substrate for a light-emitting element using it and a light-emitting device using it.

BACKGROUND ART

In recent years, along with a tendency for high brightness and whitening of a light-emitting device using a light-emitting element such as a light-emitting diode, such a light-emitting device has been used for illumination, backlight of various displays or large-sized liquid crystal TVs, etc. As a light-emitting device, for example, a light-emitting device having a lead frame mainly made of copper and on which a light-emitting element is mounted and a reflective frame so-called a reflector to surround a mounting portion of the lead frame on which a light-emitting element is mounted, has been known. In the case of such a light-emitting device, since the lead frame has a high heat conductivity, an excellent heat release property can be obtained with a relatively simple structure.

The reflector for a light-emitting device is made of, for example, a resin material in which a white inorganic pigment such as titania is dispersed and formed in an integrated structure to surround the mounting portion of the lead frame. However, the reflector made of the resin material is likely to be colored due to aged deterioration by light from a light-emitting element, and the reflectance may be lowered. Particularly, in a case where a light-emitting element which emits ultraviolet rays, near ultraviolet rays or blue light is used, the coloration or the deterioration of the reflectance due to such aged deterioration is remarkable.

In order to suppress the coloration or the deterioration of the reflectance due to the aged deterioration, it has been known, for example, to use a reflector made of a ceramic material. Since the ceramic material is an inorganic material, as compared to a resin material which is an organic material, the coloration or the deterioration of the reflectance due to aged deterioration is easily suppressed. However, since it is necessary to fire a ceramic material at a temperature exceeding 1,500° C., its productivity is not good. Further, in a case where a ceramic material is fired with a lead frame made of copper or the like, the lead frame may melt. Further, in a case of a reflector made of a ceramic material, a high reflectance cannot always be obtained.

For example, it has been known to form voids by air bubbles in a reflector made of a ceramic material in order to increase a reflectance. However, if the number of voids is large, each treating liquid used in production steps of a light-emitting device tends to penetrate into them, and as a result, the reliability of a light-emitting device may be low. Further, in a case where the inside of a reflector is filled with a sealing material to seal a light-emitting element, etc., water and vapor tend to penetrate into an interface between the reflector and the sealing material, and the reliability of the light-emitting device cannot be necessary enough.

Further, a reflector made of conventional borosilicate glass and a reflector made of a conventional borosilicate glass in which alumina, magnesia, barium sulfate or the like is incorporated are known. However, a specific composition, etc. of borosilicate glass are not necessarily clear, and properties such as reflectivity and the reliability of the borosilicate glass are not necessarily clear (e.g. Patent Document 1).

On the other hand, known is a substrate for mounting a light-emitting element, which is formed by forming a green sheet made of a glass ceramics composition containing a glass powder and a ceramic filler, laminating plural such green sheets, firing it at from 850 to 900° C. and then dividing it into individual species (Patent Document 2). In a case where a substrate for mounting a light-emitting element is formed by using such a green sheet, it is necessary to increase deflective strength in order to prevent defections such that the green sheet is broken or cracked at a time of dividing. That is why it is necessary to increase the sintering density, and when the glass ceramics composition is sintered, sintering is carried out so as to be dense to prevent voids from remaining (porosity is almost 0%). Further, silver conductors used as wiring conductors or conductive vias mainly have a role as a heat release structure. In addition, heat conductivity of the substrate itself is desired to be high. Here, if a sintered substrate has voids, the heat conductivity is remarkably lowered, which causes deterioration of the heat release property. That is, from a viewpoint of the strength and also from a viewpoint of the heat release property, after sintering the glass ceramics composition, the glass ceramics composition is sintered so as to prevent voids from remaining.

Further, in order to form a green sheet which is flexible and easy to handle, it is necessary to incorporate a large amount of a resin in a green sheet. Thus, it is necessary to heat decompose the resin in a firing step, and a heat treatment step at from 400 to 500° C. for about 5 hours is usually required.

Further, a low temperature firing substrate technique in which a green sheet is used is originally employed for simultaneously firing a silver conductive layer which is formed by printing or the like, and a firing temperature of at least 850° C. is required for sufficiently firing the silver conductive layer.

PRIOR ART DOCUMENTS

Patent Documents

Patent Document 1: WO2009/051178A1
Patent Document 2: WO2009/128354A1

DISCLOSURE OF INVENTION

Technical Problem

The present invention has been made to solve the above problem, and it is an object of the present invention to provide a reflective frame for a light-emitting element, which is used for a substrate for a light-emitting element having a metal member and excellent in a heat release property and a light-emitting device, whereby the light extraction efficiency, the reliability, the productivity, etc. can be improved. Further, it is an object of the present invention to provide a substrate for a light-emitting element and a light-emitting device which are provided with the reflective frame for a light-emitting element of the present invention and of which heat release property, light extraction efficiency, reliability, productivity, etc. are excellent.

The reflective frame for a light-emitting element of the present invention is formed to surround a mounting portion of a metal member on which a light-emitting element is mounted. The reflective frame for a light-emitting element is made of a sintered body comprising a glass material and a ceramic powder. The glass material comprises, as based on oxides, from 15 to 75 mol % of $SiO_2$, from 0 to 40 mol % of $B_2O_3$, from 0 to 10 mol % of ZnO, from 0 to 30 mol % of $Li_2O+Na_2O+K_2O$, from 5 to 35 mol % of CaO, from 5 to 40 mol % of CaO+MgO+BaO+SrO, from 0 to 20 mol % of $TiO_2$ and from 0 to 10 mol % of $Al_2O_3$.

Further, the sintered body is one fired at at most 900° C. and has a porosity of at most 15% and an average reflectance at a wave length of from 400 to 700 nm being at least 86% when the thickness is 1 mm.

The substrate for a light-emitting element of the present invention, comprises a metal member on which a light-emitting element is mounted and a reflective frame for a light-emitting element formed to surround a mounting portion of the metal member on which a light-emitting element is mounted, wherein the reflective frame for light-emitting element is the reflective frame for a light-emitting element of the present invention.

The light-emitting device of the present invention comprises a light-emitting element and a substrate for a light-emitting element, on which the light-emitting element is mounted, wherein the substrate for a light-emitting element is the substrate for a light-emitting element of the present invention.

Advantageous Effects of Invention

The reflective frame for a light-emitting element of the present invention is formed to surround a mounting portion of a metal member on which a light-emitting element is mounted, and it is made of a sintered body comprising a glass material and a ceramic powder. Such a reflective frame for a light-emitting element is used for a substrate for a light-emitting element and a light-emitting device, which has a metal member and is excellent in heat release property, and in addition to the heat release property, an excellent light extraction efficiency, an excellent reliability, an excellent productivity, etc. can be obtained.

Further, the substrate for a light-emitting element and the light-emitting device of the present invention have a metal member on which a light-emitting element is mounted and the above reflective frame for a light-emitting element, whereby in addition to an excellent heat release property by the metal member, an excellent light extraction efficiency, reliability, productivity, etc. can be obtained.

In the case of the light-emitting device of the present invention, roles are divided such that the metal member has a heat release property, and the reflective frame for a light-emitting element has a reflective property, whereby even though voids are present in the reflective frame for a light-emitting element, the heat release property is not impaired. The difference in a reflective index between voids and the materials for the frame such as the glass material and the ceramic powder, is large, and in the case of the structure in which voids are dispersed, the scatter reflection is large. By forming the highly reflective frame positively utilizing voids as light scatterers, the excellent light extraction efficiency can be obtained without impairing the heat release property.

DESCRIPTION OF EMBODIMENTS

Now, the present invention will be described in detail with reference to the drawings.

Figure 1:
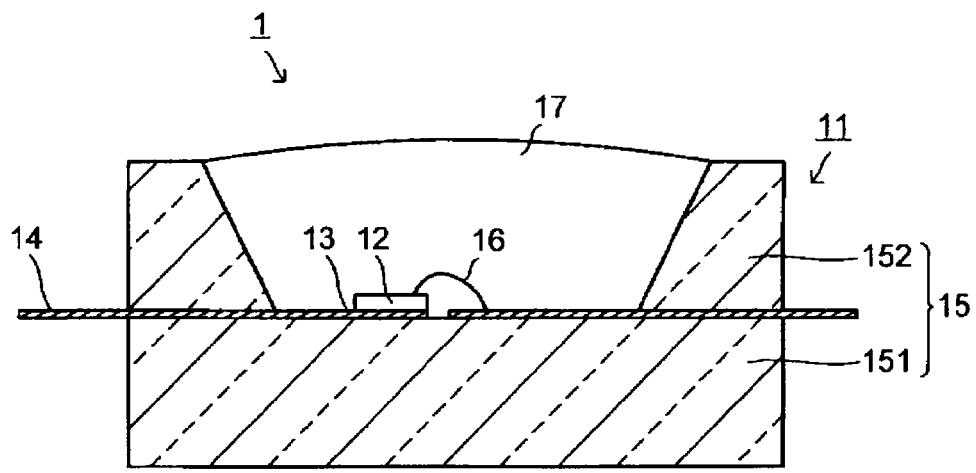
FIG. 1 is a cross-sectional view illustrating one example of a light-emitting device having the reflective frame for a light-emitting element of the present invention.

FIG. 1 is a cross-sectional view illustrating one example of the reflective frame for a light-emitting element of the present invention, and a substrate for a light-emitting element and a light-emitting device having the reflective frame of the present invention. A light-emitting device 1 has a substrate 11 for a light-emitting element (hereinafter, simply referred to as the substrate 11) and a light-emitting element 12 which is mounted on the substrate 11. The substrate 11 has a metal member 14 having a mounting portion 13 on which the light-emitting element 12 is mounted and a reflective frame 15 for a light-emitting element (hereinafter simply referred to as the reflective frame 15) which is formed to surround at least the mounting portion 13 of the metal member 14. The reflective frame 15 is one so-called a reflector and formed to improve the light extraction efficiency by reflecting light emitted mainly from the light-emitting element 12.

The light-emitting element 12 has an electrode not shown which is electrically connected to the metal member 14 by a bonding wire 16 or the like. The reflective frame 15, for example, has a substantially plate shape base member 151 and a frame member 152 which is formed to surround the mounting portion 13 on the base member 151. The reflective frame 15 has a structure such that the metal member 14 is arranged between the base member 151 and the frame member 152. Further, the reflective frame 15 has a structure such that the metal member 14 protrudes from a side part. On the frame member 152, for example in its inside, a circular hole of which diameter becomes small towards the base member 151 is formed.

The inside of such a reflective frame 15 is filled with a sealing material 17 containing a phosphor not shown. The light-emitting element 12 and the bonding wire 16 are filled with the sealing material 17.

The light-emitting element 12 may, for example, be one which emits light to excite the phosphor contained in the sealing material 17, whereby white light is emitted as a mixed color. As such a light-emitting element 12, a blue light-emitting type light-emitting diode element or a UV light-emitting type light-emitting diode element may, for example, be mentioned.

The metal member 14 is not particularly restricted, so long as a light-emitting element 12 may be mounted thereon, and it has a function as an electrode which is electrically connected to the light-emitting element 12. A known thin metal plate made of copper or a copper alloy, such as a lead frame may, for example, be used. As the metal member 14, a thin metal plate made of copper or a copper alloy having a heat conductivity of at least 300 W/m·K is particularly preferred, and for example, one made of oxygen-free copper alloy having a copper content of at least 99.9% is preferred. By using such a thin metal plate, the heat release property is more improved. Further, as the metal member 14, one made of copper or a copper alloy is preferred, however, the metal member 14 may, for example, be made of aluminum, an aluminum alloy, an iron/nickel alloy or a plated aluminum alloy (plated with nickel).

The sealing material 17 may, for example, be made of a resin material such as a silicone resin or an epoxy resin. Among them, the silicone resin is preferred, since the light resistance and heat resistance are excellent. A phosphor or the like may be incorporated in such a resin material. By incorporating the phosphor or the like in the resin material, a light color to be emitted may be appropriately controlled.

The reflective frame 15 is made of a sintered body comprising a glass material and a ceramic powder. The sintered body is one fired at at most 900° C. and has a porosity of at most 15% and an average reflectance at a wavelength of from 400 to 700 nm being at least 86% when the thickness is 1 mm.

Further, the glass material for the sintered body comprises, as based on oxides, from 15 to 75 mol % of $SiO_2$, from 0 to 40 mol % of $B_2O_3$, from 0 to 10 mol % of ZnO, from 0 to 30 mol % of $Li_2O+Na_2O+K_2O$, from 5 to 35 mol % of CaO, from 5 to 40 mol % of CaO+MgO+BaO+SrO, from 0 to 20 mol % of $TiO_2$ and from 0 to 10 mol % of $Al_2O_3$.

Since the above-mentioned substrate 11 for a light-emitting element and the above-mentioned light-emitting device 1 have the metal member 14, an excellent heat release property can be obtained with a relatively simple structure. Further, since such a substrate 11 for a light-emitting element and such a light-emitting device 1 are provided with a reflective frame 15 made of the above-mentioned sintered body, in addition to the heat release property, the light extraction efficiency, the reliability, the productivity, etc. are improved.

Further, since one fired at at most 900° C. is used, for example as compared with one made of a ceramics such as alumina, the firing temperature can be lowered, and the productivity can be improved. Further, when the firing temperature is at most 900° C., the metal member 14 made of copper or a copper alloy can be prevented from melting, and the reflective frame can be produced by firing with the metal member. Further, it is not always necessary to produce the sintered body by firing with the metal member 14, and a separately fired sintered body may be jointed to the metal member 14. The firing temperature is not particularly restricted, so long as it is at most 900° C., and the firing temperature varies depending on the glass composition. However, the firing temperature is usually from 500 to 900° C.

If the porosity exceeds 15%, each treating liquid used in steps for producing the light-emitting device 1 tends to penetrate, and the reliability of the light-emitting device 1 may be impaired. Further, even in a case where the inside of the sintered body, namely the reflective frame 15 is filled with a sealing material 17, water and steam tend to penetrate into an interface between the sintered body and the sealing material 17, and thereby the reliability of the light-emitting device 1 cannot be sufficiently secured. Further, in such a case, cracks are likely to be formed due to handling at the time of production, and the productivity may be impaired. Further, even after production, the strength against impact is not enough, and damages may be caused. From the viewpoint of securing the reliability of the light-emitting device 1, the porosity of the sintered body is preferably at most 14%. In order to increase scatter reflections in the inside of the reflective frame 15, the porosity is preferably at least 1.5%, more preferably at least 4%, further preferably at least 6%.

Further, the porosity is obtained by the following formula. Here, the bulk density is measured by the Archimedian method or calculation based on size and mass, and the true density is measured by the vapor phase displacement method (pycnometer method):

Porosity [%]=(1−(bulk density/true density))×100

If the average reflectance is less than 86%, the light extraction efficiency of the light-emitting device 1 may be insufficient. From the viewpoint of improving the light extraction efficiency of the light-emitting device 1, the average reflectance is preferably at least 90%, more preferably at least 92%. Further, the average reflectance is an average reflectance calculated from reflectances measured at each 20 nm between the wavelength of from 400 to 700 nm. In order to improve the average reflectance, it is preferred that the content of a ceramic powder in the sintered body is increased, or a ceramic powder of which the refractive index is largely different from that of the glass material is used.

Such a sintered body is made of a glass material and a ceramic powder and obtained by making the glass material have the above-mentioned composition. That is, by employing such a glass material and such a ceramic powder, the material may be fired at at most 900° C., whereby a sintered body having a porosity of at most 15% and an average reflectance of at least 86%, preferably at least 90% can be obtained. Particularly, by using the glass material having the above-mentioned glass composition, even in a case where the content of the ceramic powder is large, the material may be sintered, and even in the content of the ceramic powder is large, the reflectance is improved, and the porosity becomes low.

Now, respective components of a glass material will be described.

$SiO_2$ is a glass network former, and it is a component to increase chemical durability, particularly acid resistance and thus is essential. If the content of $SiO_2$ is less than 15 mol %, the chemical durability is likely to be inadequate. On the other hand, if the content of $SiO_2$ exceeds 75 mol %, the melting temperature of the glass tends to be high, or the glass softening point (Ts) tends to be too high.

$B_2O_3$ is not an essential component, but is preferably contained since it is a glass network former and a component to lower the softening point. If the content of $B_2O_3$ exceeds 40 mol %, it becomes difficult to obtain a stable glass, or the chemical durability may deteriorate.

ZnO is not an essential component, but is a useful as a component to lower the softening point. If the content of ZnO exceeds 10 mol %, the chemical durability may deteriorate. Further, glass is likely to be crystallized at a time of being fired, sintering is likely to be impaired, and the porosity of a sintered body may not be reduced.

$Li_2O$, $Na_2O$ and $K_2O$ as alkali metal oxides are not essential components, but are useful as components to lower the softening point. One or two among $Li_2O$, $Na_2O$ and $K_2O$ may also be contained therein. If the total content thereof exceeds 30 mol %, the chemical durability, particularly the acid resistance tends to deteriorate.

CaO is a component to increase the glass stability and lower the softening point. Particularly, CaO is an essential component to improve the wettability of an alumina powder to glass when fired and has an effect to reduce a porosity of a sintered body. Further, CaO is a component to increase thermal expansion coefficient and useful to adjust the balance of the thermal expansion coefficient with other materials for a substrate, etc. If the content of CaO is less than 5 mol %, the glass stability is not likely to be increased adequately, or the softening point is not likely to be lowered sufficiently. On the other hand, if the content of CaO exceeds 35 mol %, since such a content is too excessive, when fired, glass is likely to be crystallized, sintering is likely to be impaired, and the porosity of a sintered body may not be reduced. Further, the glass stability may deteriorate.

Further, as a component to increase the glass stability and lower the softening point substantially similarly to CaO, at least one member selected from the group consisting of MgO, BaO and SrO may be contained therein. In such a case, the total content of MgO, BaO and SrO including the content of CaO is at most 40 mol %. If the total content of CaO, MgO, BaO and SrO exceeds 40 mol %, the glass stability is likely to deteriorate. Further, the total content of MgO, BaO and SrO except CaO is preferably at most 15 mol %.

$TiO_2$ is not an essential component, but is useful as a component to improve the weather resistance of glass. If the content of $TiO_2$ exceeds 20 mol %, the stability of glass may deteriorate.

$Al_2O_3$ is not an essential component but is useful as a component to increase the glass stability and chemical durability. If the content of $Al_2O_3$ exceeds 10 mol %, the softening point tends to be excessively high. For example, in a case where the content of $SiO_2$ is at least 40 mol %, the content of $Al_2O_3$ is preferably at least 2 mol %, more preferably at least 3 mol %.

It is preferred that the glass material basically comprises the above components, however, so long as the object of the present invention is not impaired, the glass material may contain materials other than the above components. For example, $P_2O_5$ may be contained in order to improve the stability of the glass and to lower the softening point. Further, for example, $Sb_2O_3$ may be contained in order to improve the stability of the glass. Further, in a case where other materials are contained, the total content of such other materials is at most 10 mol %, preferably at most 5 mol %.

Now, as examples of the above-mentioned glass materials, more preferred first glass material to third glass material will be described.

The first glass material comprises, as based on oxides, from 40 to 75 mol % of $SiO_2$, from 0 to 20 mol % of $B_2O_3$, from 0 to 5 mol % of ZnO, from 0.1 to 10 mol % of $Li_2O+Na_2O+K_2O$, from 10 to 35 mol % of CaO, from 10 to 35 mol % of CaO+MgO+BaO+SrO, from 0 to 5 mol % of $TiO_2$ and from 0 to 10 mol % of $Al_2O_3$.

The first glass material contains a large amount of $SiO_2$, and even in a case where a large amount of a ceramic powder is contained, such a glass material can be effectively sintered, and the chemical durability is also excellent. Thus, such a glass material is preferred. As the first glass material, the following first glass material (a) and the following first glass material (b) are more preferred.

The first glass material (a) comprises, as based on oxides, from 55 to 65 mol % of $SiO_2$, from 10 to 20 mol % of $B_2O_3$, from 0 to 5 mol % of ZnO, from 1 to 5 mol % of $Li_2O+Na_2O+K_2O$, from 10 to 20 mol % of CaO, from 10 to 25 mol % of CaO+MgO+BaO+SrO, from 0 to 5 mol % of $TiO_2$ and from 0 to 10 mol % of $Al_2O_3$.

Particularly, even in a case where a large amount of ceramic powder is contained, the first glass material (a) can be effectively sintered, and the chemical durability is also excellent.

The first glass material (a) more preferably comprises, as based on oxides, from 57 to 63 mol % of $SiO_2$, from 12 to 18 mol % of $B_2O_3$, from 0 to 3 mol % of ZnO, from 1 to 5 mol % of $Li_2O+Na_2O+K_2O$, from 12 to 18 mol % of CaO, from 12 to 20 mol % of CaO+MgO+BaO+SrO, from 0 to 3 mol % of $TiO_2$ and from 2 to 8 mol % of $Al_2O_3$.

The first glass material (b) comprises, as based on oxides, from 65 to 75 mol % of $SiO_2$, from 0 to 5 mol % of $B_2O_3$, from 0 to 5 mol % of ZnO, from 5 to 12 mol % of $Li_2O+Na_2O+K_2O$, from 15 to 25 mol % of CaO, from 15 to 30 mol % of CaO+MgO+BaO+SrO, from 0 to 5 mol % of $TiO_2$ and from 0 to 5 mol % of $Al_2O_3$.

As compared to the first glass material (a), the first glass material (b) contains a large amount of $SiO_2$ and alkali metal oxides (such as $Li_2O$), whereby even in a case where the content of a ceramic powder is relatively low, a high reflectance can be obtained. Thus, the first glass material (b) is preferred.

More preferably, the first glass material (b) comprises, as based on oxides, from 67 to 73 mol % of $SiO_2$, from 0 to 3 mol % of $B_2O_3$, from 0 to 3 mol % of ZnO, from 6 to 11 mol % of $Li_2O+Na_2O+K_2O$, from 16 to 22 mol % of CaO, from 16 to 25 mol % of CaO+MgO+BaO+SrO, from 0 to 3 mol % of $TiO_2$ and from 0 to 3 mol % of $Al_2O_3$.

The second glass material comprises, as based on oxides, from 15 to 25 mol % of $SiO_2$, from 25 to 40 mol % of $B_2O_3$, from 0 to 10 mol % of ZnO, from 0 to 5 mol % of $Li_2O+Na_2O+K_2O$, from 20 to 35 mol % of CaO, from 20 to 40 mol % of CaO+MgO+BaO+SrO, from 0 to 5 mol % of $TiO_2$ and from 0 to 5 mol % of $Al_2O_3$.

The second glass material has a lower content of $SiO_2$ and a higher content of $B_2O_3$ than the first glass material, and thereby as compared to the first glass material, the second glass material can be fired at a lower temperature, for example, at most 800° C., usually from 700 to 800° C., and a sintered body having a low porosity can be obtained, such being preferred.

The second glass material more preferably comprises, as based on oxides, from 17 to 23 mol % of $SiO_2$, from 32 to 38 mol % of $B_2O_3$, from 2 to 7 mol % of ZnO, from 0 to 3 mol % of $Li_2O+Na_2O+K_2O$, from 22 to 30 mol % of CaO, from 30 to 38 mol % of CaO+MgO+BaO+SrO, from 0 to 3 mol % of $TiO_2$ and from 1 to 4 mol % of $Al_2O_3$.

The third glass material comprises, as based on oxides, from 15 to 45 mol % of $SiO_2$, from 0 to 10 mol % of $B_2O_3$, from 0 to 5 mol % of ZnO, from 15 to 30 mol % of $Li_2O+Na_2O+K_2O$, from 5 to 20 mol % of CaO, from 5 to 20 mol % of CaO+MgO+BaO+SrO, from 5 to 20 mol % of $TiO_2$ and from 0 to 10 mol % of $Al_2O_3$.

As compared to the second glass material, the third glass material contains a large amount of alkali metal oxides ($Li_2O$, $Na_2O$ and $K_2O$), and thereby as compared to the second glass material, the third glass material can be fired at a low temperature, for example at most 600° C., usually from 500 to 600° C., such being preferred. Further, since the acid resistance of one containing a large amount of alkali metal oxides ($Li_2O$, $Na_2O$ and $K_2O$) tends to be lowered, a large amount of $TiO_2$ is contained in order to improve the acid resistance.

The third glass material more preferably comprises, as based on oxides, from 35 to 42 mol % of $SiO_2$, from 2 to 8 mol % of $B_2O_3$, from 0 to 3 mol % of ZnO, from 24 to 30 mol % of $Li_2O+Na_2O+K_2O$, from 5 to 10 mol % of CaO, from 6 to 12 mol % of CaO+MgO+BaO+SrO, from 11 to 16 mol % of $TiO_2$ and from 0 to 3 mol % of $Al_2O_3$.

On the other hand, as the ceramic powder, for example, an alumina powder, a zirconia powder, a titania powder or a mixture thereof may be preferably used. Among them, the alumina powder, the zirconia powder or a mixture thereof may be preferably used.

The content of such a ceramic powder is preferably from 35 to 60 vol %, more preferably from 45 to 60 vol %, per the total amount of the glass material and the ceramic powder. If the content of the ceramic powder is less than 35 vol %, a sufficient reflectance may not be obtained. On the other hand, if the content of the ceramic powder exceeds 60 vol %, a sintering property deteriorates, and a sufficient strength may not be obtained.

The 50% particle size ($D_{50}$) of the ceramic powder is not particularly restricted, however, for example 0.5 to 4 μm is preferred, and from 1.0 to 3.0 μm is more preferred. Further, in the present specification, the 50% particle size ($D_{50}$) is one measured by using a laser diffraction/scattering particle size distribution measuring apparatus.

The above-mentioned sintered body, namely reflective frame 15, can be produced by forming a glass ceramics composition which is a mixture obtained by mixing a glass powder having the above glass composition and a ceramic powder into the predetermined shape and firing it.

The glass powder can be prepared by producing glass having the above glass composition by a melting process, followed by grinding the glass by a dry grinding method or a wet grinding method. In the case of the wet grinding method, water is preferably used as a solvent. The grinding may, for example, be carried out by using a grinding machine such as a roll mill, a ball mill or a jet mill.

The 50% particle size ($D_{50}$) of the glass powder is preferably from 0.5 to 4 μm, more preferably from 1.0 to 3.0 μm. If the 50% particle size of the glass powder is less than 0.5 μm, it is difficult to handle such a glass powder due to agglomeration, and time required for forming a glass powder may be long. On the other hand, if the 50% particle size of the glass powder exceeds 4 μm, a softening point may raise, or sintering may be insufficient. Further, the maximum particle size of the glass powder is preferably at most 20 μm. If the maximum particle size exceeds 20 μm, the sintering property of the glass powder deteriorates, and not molten components remain in a sintered body, whereby the reflectance may be low. The maximum particle size of the glass powder is more preferably at most 10 μm. The particle size may be adjusted by, for example, classifying a glass powder after grinding as a case requires.

The glass ceramics composition comprising such a glass powder and such a ceramic powder can be formed by using a mold or the like. In such a case, the glass ceramic powder is preferably processed into a granulated powder, a paste or a slurry so as to obtain a flowability to be filled in a mold. As the granulated powder, typical is one prepared by mixing a powder with a water-soluble resin having an excellent heat decomposable property and water, followed by drying to be a granulated form by a spray dryer, however, another granulated powder prepared by a known method such as a tumbling granulation method may be used. Further, the paste or the slurry can be obtained by mixing a powder with a resin having an excellent heat decomposable property, a solvent having an appropriate drying property and a resin-solubility, etc., followed by uniformly dispersing. Particularly, in a case where a reflective frame 15 for a light-emitting element is formed by using a granulated powder, it may be formed by adding a trace amount of a resin, and a heat treatment at from 400 to 500° C. for degreasing becomes a short time or is not necessary, whereby the productivity can be improved.

Figure 2:
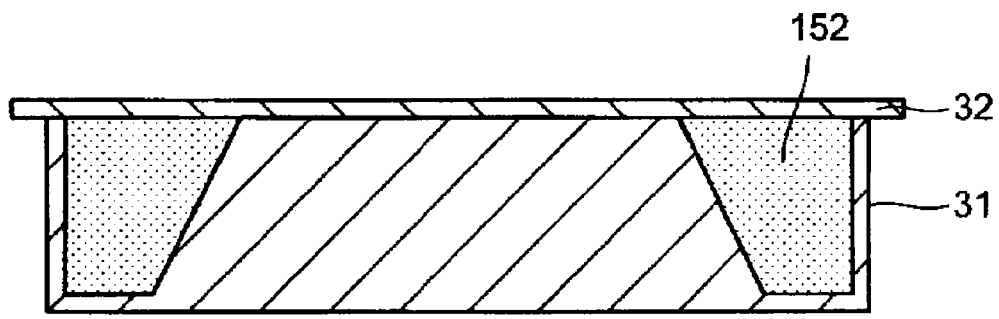
FIG. 2 is a cross-sectional view illustrating one example of a method for forming a frame member of the reflective frame for a light-emitting element shown in FIG. 1.

FIG. 2 is a cross-sectional view illustrating one example of a method for forming a frame member 152. Here, a glass ceramics composition to be a frame member 152 and a formed body obtained by forming the glass ceramic composition will be explained with reference to the same number. A glass ceramic composition 152 prepared as a granulated powder or the like is filled in, for example, a mold 31 having a concave part which is the same shape as the frame member 152, and then the mold 31 is covered with a press plate 32, and extrusion molding is carried out so as to pack the glass ceramic composition 152 by applying pressure by a pressing machine or the like to form a formed body 152. Such a formed body 152 is removed from the mold 31, fired and cooled to form a frame member 152.

Figure 3:
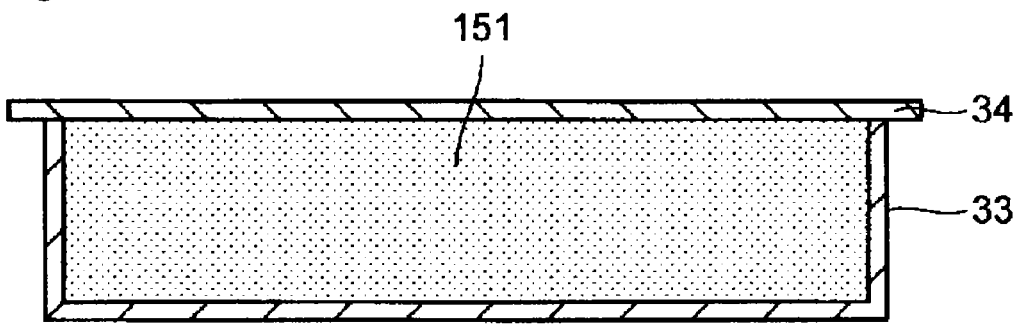
FIG. 3 is a cross-sectional view illustrating one example of a method for forming a base member of the reflective frame for a light-emitting element shown in FIG. 1.

As shown in FIG. 3, also with respect to the base member 151, a glass ceramic composition 151 prepared as a granulated powder or the like is filled in a mold 33 having a concave part which is the same shape as the base member 151, and then the mold 33 is covered with a press plate 34, and extrusion molding is carried out so as to pack the glass ceramic composition 151 by applying pressure by a pressing machine or the like to form a formed body 151. Such a formed body 151 is removed from the mold 33, fired and cooled to form a base member 151. Here, the formed body 151 and the formed body 152 are not necessarily removed from the mold 31 and the mold 33 and may be fired in the mold 31 and the mold 33.

Figure 4:
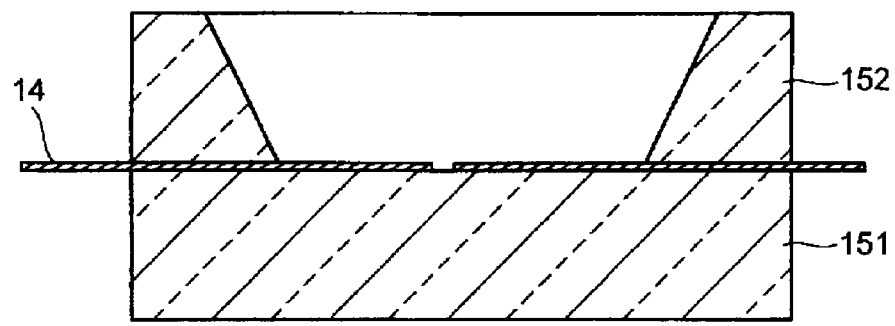
FIG. 4 is a cross-sectional view illustrating one example of a method for joining the frame member and the base member.

Next, for example, a known organic or inorganic adhesive is applied on a main surface of the base member 151 on which a metal member 14 and a frame member 152 are to be arranged, and then the metal member 14 and the frame member 152 are arranged on predetermined positions as shown in FIG. 4, and the adhesive is reacted by heat or the like to adhere them, whereby a substrate 11 having the metal member 14 is unified with the reflective frame 15 comprising the base member 151 and the frame member 152 can be obtained. The substrate 11 thus obtained is, after mounting a light-emitting element 12, sealed with a sealing member 17 to produce a light-emitting device 1.

Figure 5:
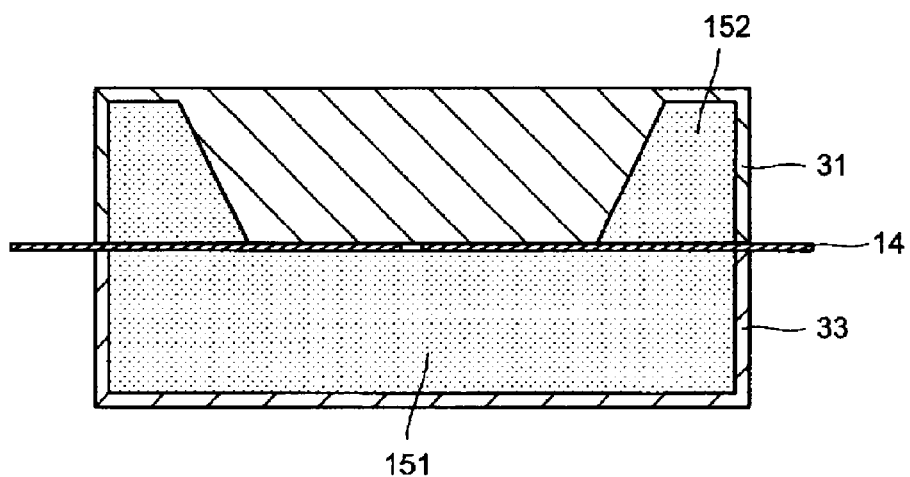
FIG. 5 is a cross-sectional view illustrating one example of a method for forming a reflective frame for a light-emitting element shown in FIG. 1.

On the other hand, rather than by bonding a base member 151 and a frame member 152 which are separately formed and fired, a light-emitting device 1 can be produced at a low cost by forming and firing a base member 151 and a frame member 152 together. In such a case, as shown in FIG. 5, molds 31 and 33 are arranged so as to sandwich a metal member 14, glass ceramics compositions 151 and 152 are filled in them, followed by molding, and they are fired together. Here, an adhesive property between the metal member 14 and the base member 151 and the frame member 152 can be improved by excising ingenuity for example by forming via holes on the metal member 14 or applying an inorganic adhesive on both main surfaces of the metal member 14.

Firing varies depending on the glass composition, however, firing is preferably carried out for example by keeping the temperature at 500 to 900° C. for from 10 to 60 minutes. If the firing temperature is lower than 500° C., the glass ceramic compositions 151 and 152 cannot be sufficiently sintered, and for example, one having a porosity of at most 15% may not be obtained. On the other hand, if the firing temperature exceeds 900° C., for example, in a case where a metal member 14 made of copper or a copper alloy is fired together, the metal member 14 may melt. Further, when the firing temperature is at most 750° C. or at most 600° C., a metal member which is not likely to be corroded, such as aluminum, an aluminum alloy, an iron/nickel alloy or a plated aluminum alloy (plated with nickel), may be used, whereby an excellent reliability and an excellent productivity can be obtained. Further, if the firing time is less than 10 minutes, the glass ceramics compositions 151 and 152 cannot be sufficiently fired, and for example one having a porosity of at most 15% may not be obtained. On the other hand, the firing time is sufficient at a level of 60 minutes, and if fired for longer than 60 minutes, densification cannot effectively progress, and productivity may be low.

As described above, the reflective frame 15 of the present invention is explained with reference to one example, however, so long as the reflective frame 15 of the present invention has at least a part to surround a mounting portion 13 of a metal member 14, shape, etc. are not particularly restricted. For example, the reflective frame 15 of the present invention is not always required to have a base member 151 and a frame member 152, and may be one substantially having only a frame member 152 without a base member 151.

Further, it is not always necessary to form a metal member 14 so as to protrude to the outside of a reflective frame 15, and it is not always necessary to embed a metal member 14 in the inside of the reflective frame 15, for example at the boundary between the base member 151 and the frame member 152. The metal member 14 may be arranged along the inside surface of the reflective frame 15, for example along the inside surface of the base member 151 or the frame member 152.

By using the reflective frame 15 of the present invention for the substrate 11 and the light-emitting device 1 which have the metal member 14 having an excellent heat release property, in addition to the heat release property, the light extraction efficiency, the reliability, the productivity, etc. can be improved. Further, since the substrate 11 for a light-emitting element and the light-emitting device 1 of the present invention have the metal member 14 and the reflective frame 15, in addition to an excellent heat release property, an excellent light extraction efficiency, reliability, productivity, etc. can be obtained. Accordingly, the light-emitting device 1 of the present invention can be preferably used as, for example, a backlight for a liquid crystal display, etc., a light-emitting member for handling buttons of a personal digital assistant, an illumination for automobile or decoration and other light resources.

EXAMPLES

Now, the present invention will be described in further detail with reference to Examples. However, it should be understood that the present invention is by no means restricted to such Examples.

Example 1

Respective glass raw materials were blended and mixed so that the respective components would be 60.4 mol % of $SiO_2$, 15.6 mol % of $B_2O_3$, 1.0 mol % of $Na_2O$, 2.0 mol % of $K_2O$, 15.0 mol % of CaO and 6.0 mol % of $Al_2O_3$ (corresponding to the first glass material (a)); and this raw material mixture was put into a platinum crucible and melted at a temperature of from 1,400 to 1,500° C. for 60 minutes. Then, this molten state glass was cast and cooled. A glass thus obtained was dry-ground by a ball mill made of alumina for from 6 to 12 hours and further wet-ground for from 7 to 15 hours to obtain a glass powder. Here, water was used as a solvent for grinding.

To the glass powder, an alumina powder (tradename: AL-M43, manufactured by Sumitomo Chemical Co., Ltd.) was blended and mixed so that the alumina powder would be 38 vol %, to obtain a glass ceramics composition. The glass ceramics composition was fired at 875° C. for 20 minutes to prepare a plate specimen having a thickness of 1.0 mm and a size of 50 mm×50 mm as a reflective frame for a light-emitting element.

Example 2

A glass ceramics composition was prepared in the same manner as in Example 1, except that the alumina powder was blended so as to be 53 vol % and mixed. The subsequent steps were carried out in the same manner as in Example 1, and the glass ceramics composition was fired at 875° C. for 20 minutes to prepare a specimen having a thickness of 1.1 mm as a reflective frame for a light-emitting element.

Example 3

A glass ceramics composition was prepared in the same manner as in Example 1, except that an alumina powder and a zirconia powder (trade name: HSY-3F-J, manufactured by DAIICHI KIGENSO KOGYO CO., LTD.) were blended so as to be 30 vol % and 14 vol % respectively and mixed. The subsequent steps were carried out in the same manner as in Example 1, and the glass ceramics composition was fired at 875° C. for 20 minutes to prepare a specimen having a thickness of 1.1 mm as a reflective frame for a light-emitting element.

Example 4

Respective glass raw materials were blended and mixed so that the respective components would be 70.3 mol % of $SiO_2$, 4.5 mol % of $Na_2O$, 3.7 mol % of $K_2O$, 18.9 mol % of CaO and 2.6 mol % of $Al_2O_3$ (corresponding to the first glass material (b)); and this raw material mixture was put into a platinum crucible and melted at a temperature of from 1,400 to 1,500° C. for 60 minutes. Then, this molten state glass was cast and cooled. A glass thus obtained was dry-ground by a ball mill made of alumina for from 6 to 12 hours and further wet-ground for from 7 to 15 hours to obtain a glass powder. Here, water was used as a solvent for grinding.

To the glass powder, an alumina powder (tradename: AL-M43, manufactured by Sumitomo Chemical Co., Ltd.) was blended and mixed so that the alumina powder would be 39 vol %, to obtain a glass ceramics composition. The glass ceramics composition was fired at 875° C. for 20 minutes to prepare a plate specimen having a thickness of 1.2 mm as a reflective frame for a light-emitting element.

Example 5

Respective glass raw materials were blended and mixed so that the respective components would be 20.0 mol % of $SiO_2$, 35.0 mol % of $B_2O_3$, 4.5 mol % of ZnO, 25.0 mol % of CaO, 5.0 mol % of SrO, 5.0 mol % of BaO and 2.5 mol % of $Al_2O_3$ (corresponding to the second glass material); and this raw material mixture was put into a platinum crucible and melted at a temperature of from 1,300 to 1,400° C. for 60 minutes. Then, this molten state glass was cast and cooled. A glass thus obtained was dry-ground by a ball mill made of alumina for from 6 to 12 hours and further wet-ground for from 7 to 15 hours to obtain a glass powder. Here, water was used as a solvent for grinding.

To the glass powder, an alumina powder (tradename: AL-M43, manufactured by Sumitomo Chemical Co., Ltd.) was blended and mixed so that the alumina powder would be 50 vol %, to obtain a glass ceramics composition. The glass ceramics composition was fired at 750° C. for 20 minutes to prepare a plate specimen having a thickness of 1.4 mm as a reflective frame for a light-emitting element.

Example 6

Respective glass raw materials were blended and mixed so that the respective components would be 37.9 mol % of $SiO_2$, 4.5 mol % of $B_2O_3$, 3.0 mol % of $Li_2O$, 17.4 mol % of $Na_2O$, 6.5 mol % of $K_2O$, 7.5 mol % of CaO, 1.4 mol % of SrO, 0.3 mol % of $Al_2O_3$, 1.6 mol % of $P_2O_5$, 0.6 mol % of $Sb_2O_3$ and 14.0 mol % of $TiO_2$ (corresponding to the third glass material); and this raw material mixture was put into a platinum crucible and melted at a temperature of from 1,300 to 1,400° C. for 60 minutes. Then, this molten state glass was cast and cooled. A glass thus obtained was dry-ground by a ball mill made of alumina for from 6 to 12 hours and further wet-ground for from 7 to 15 hours to obtain a glass powder. Here, water was used as a solvent for grinding.

To the glass powder, an alumina powder (tradename: AL-M43, manufactured by Sumitomo Chemical Co., Ltd.) was blended and mixed so that the alumina powder would be 57 vol %, to obtain a glass ceramics composition. The glass ceramics composition was fired at 600° C. for 20 minutes to prepare a plate specimen having a thickness of 1.0 mm as a reflective frame for a light-emitting element.

Next, the porosity and the average reflectance of the specimens of the examples were measured by the following methods. Results are shown in Table 1. Here, for comparison, the reflectance of two alumina substrates (manufactured by Hokuriku Ceramics Co., Ltd., 96% alumina substrate having a thickness of 0.65 mm and 96% alumina substrate having a thickness of 1.1 mm).

(Porosity)

The porosity was obtained by the following formula:

Porosity [%]=(1−(bulk density/true density))×100

Here, the bulk density was measured by the Archimedian method, and the true density was measured by the gas phase substitution method (pycnometer method).

(Average Reflectance)

The average reflectance was obtained by measuring a reflectance of each 20 nm in the wavelength of from 400 to 700 nm by CM-508d in SCI model, manufactured by Konica Minolta Holdings, Inc. and calculating an average of the reflectances. Further, as a reference for machine calibration, white calibration plate made of an alumina was used.

TABLE 1

|  |  | Examples | | | | | | Comparative Examples | |
|---|---|---|---|---|---|---|---|---|---|
|  |  | | | | | | | Alumina | Alumina |
|  |  | 1 | 2 | 3 | 4 | 5 | 6 | substrate 1 | substrate 2 |
| Ceramics powder [vol %] | $Al_2O_3$ | 38 | 53 | 30 | 39 | 50 | 57 | — | — |
|  | $ZrO_2$ | — | — | 14 | — | — | — | — | — |
| Glass composition [mol %] | $SiO_2$ | 60.4 | 60.4 | 60.4 | 70.3 | 20.0 | 37.9 | | |
|  | $B_2O_3$ | 15.6 | 15.6 | 15.6 | — | 35.0 | 4.5 | | |
|  | ZnO | — | — | — | — | 4.5 | — | | |
|  | $Li_2O$ | — | — | — | — | — | 3.0 | | |
|  | $Na_2O$ | 1.0 | 1.0 | 1.0 | 4.5 | — | 17.4 | | |
|  | $K_2O$ | 2.0 | 2.0 | 2.0 | 3.7 | — | 6.5 | | |
|  | CaO | 15.0 | 15.0 | 15.0 | 18.9 | 25.0 | 7.5 | | |
|  | ZrO | — | — | — | — | 5.0 | 1.4 | | |
|  | BaO | — | — | — | — | 5.0 | — | | |
|  | $Al_2O_3$ | 6.0 | 6.0 | 6.0 | 2.6 | 2.5 | 0.3 | | |
|  | $P_2O_5$ | — | — | — | — | — | 1.6 | | |
|  | $Sb_2O_3$ | — | — | — | — | — | 0.6 | | |
|  | $TiO_2$ | — | — | — | — | — | 14.0 | | |
| Firing temperature [° C.] | | 875 | 875 | 875 | 875 | 750 | 600 | — | — |
| Thickness [mm] | | 1.0 | 1.1 | 1.1 | 1.2 | 1.4 | 1.0 | 0.65 | 1.1 |
| Porosity [%] | | 3 | 14 | 11 | 10 | 5 | 12 | — | — |
| Reflectance [%] | 400 nm | 84.4 | 90.8 | 94.0 | 90.6 | 88.1 | 93.3 | 81.9 | 85.4 |
|  | 420 nm | 84.8 | 91.4 | 94.0 | 91.6 | 89.3 | 94.1 | 82.2 | 86.4 |
|  | 440 nm | 85.2 | 91.5 | 94.1 | 92.0 | 89.9 | 94.5 | 82.1 | 86.8 |
|  | 460 nm | 85.8 | 91.5 | 94.3 | 92.5 | 90.6 | 94.7 | 82.4 | 86.8 |
|  | 480 nm | 85.8 | 91.9 | 94.0 | 93.0 | 90.8 | 94.8 | 82.4 | 86.9 |
|  | 500 nm | 86.5 | 92.2 | 94.7 | 93.0 | 91.6 | 95.1 | 82.9 | 86.9 |
|  | 520 nm | 86.3 | 92.2 | 94.4 | 93.2 | 91.7 | 95.2 | 82.6 | 86.6 |
|  | 540 nm | 86.5 | 92.3 | 94.5 | 93.4 | 92.0 | 95.3 | 82.5 | 86.0 |
|  | 560 nm | 87.4 | 93.1 | 95.3 | 93.8 | 92.7 | 95.7 | 82.9 | 85.8 |
|  | 580 nm | 87.8 | 93.8 | 95.4 | 94.3 | 93.2 | 95.8 | 82.8 | 85.5 |
|  | 600 nm | 87.6 | 94.1 | 95.0 | 94.4 | 93.2 | 95.8 | 82.5 | 85.6 |
|  | 620 nm | 88.2 | 94.4 | 95.6 | 94.5 | 93.7 | 96.0 | 82.7 | 85.7 |
|  | 640 nm | 88.3 | 94.4 | 95.6 | 94.5 | 93.9 | 96.0 | 82.8 | 85.8 |
|  | 660 nm | 88.3 | 94.6 | 95.6 | 94.6 | 94.1 | 96.2 | 82.7 | 86.5 |
|  | 680 nm | 88.5 | 94.7 | 95.8 | 94.7 | 94.4 | 96.4 | 82.9 | 86.8 |
|  | 700 nm | 88.3 | 95.0 | 95.5 | 94.9 | 94.5 | 96.5 | 83.2 | 87.7 |
|  | Average | 86.9 | 93.0 | 94.9 | 93.4 | 92.1 | 95.3 | 82.6 | 86.3 |

As is evident from Table 1, all of the specimens prepared in Examples 1 to 6 could be fired at at most 900° C. and had a porosity of at most 15% and an average reflectance of at least 86%. Thus, they can be preferably used for a light-emitting device. Particularly, the respective test samples prepared in Examples 2 to 6 had a reflectance of at least 90%. Thus, they can be preferably used for a light-emitting device.

INDUSTRIAL APPLICABILITY

A substrate for a light-emitting device and a light-emitting device which are provided with the reflective frame for a light-emitting device of the present invention have an excellent heat release property, an excellent light extraction efficiency, reliability, etc., and thereby they can be used as a backlight for a liquid crystal display, etc., a light-emitting member for handling buttons of a personal digital assistant, an illumination for automobile or decoration and other light resources.

This application is a continuation of PCT Application No. PCT/JP2011/065514, filed on Jul. 6, 2011, which is based upon and claims the benefit of priority from Japanese Patent Application No. 2010-154884 filed on Jul. 7, 2010. The contents of those applications are incorporated herein by reference in its entirety.

REFERENCE SYMBOLS

1: light-emitting device, 11: substrate for a light-emitting element, 12: light-emitting element, 13: mounting part, 14: metal member, 15: reflective frame for a light-emitting element, 151: base member, 152: frame member, 16: bonding wire, 17: sealing material

What is claimed is:

1. A reflective frame for a light-emitting element, which is formed to surround a mounting portion of a metal member on which a light-emitting element is mounted, and which is made of a sintered body comprising a glass material and a ceramic powder; wherein the glass material comprises, as based on oxides, from 15 to 25 mol % of $SiO_2$, from 25 to 40 mol % of $B_2O_1$, from 0 to 10 mol % of ZnO, from 0 to 5 mol % of $Li_2O+Na_2O+K_2O$, from 20 to 35 mol % of CaO, from 20 to 40 mol % of CaO+MgO+BaO+SrO, from 0 to 5 mol % of $TiO_2$ and from 0 to 5 mol % of $Al_2O_3$; and the sintered body is one fired at at most 900° C. and has a porosity of at most 15% and an average reflectance at a wave length of from 400 to 700 nm being at least 86% when the thickness is 1 mm.

2. The reflective frame for a light-emitting element according to claim 1, wherein the content of the ceramic powder is from 35 to 60 volume % in the total amount of the glass material and the ceramic powder.

3. The reflective frame for a light-emitting element according to claim 1, wherein the ceramic powder is alumina powder, zirconia powder or a mixture thereof.

4. A substrate for a light-emitting element, comprising a metal member on which a light-emitting element is mounted, and a reflective frame for a light-emitting element formed to surround a mounting portion of the metal member on which a light-emitting element is mounted, wherein the reflective frame for a light-emitting element is the reflective frame for a light-emitting element as defined in claim 1.

5. A light-emitting device comprising a light-emitting element and a substrate for a light-emitting element, on which the light-emitting element is mounted, wherein the substrate for a light-emitting element is the substrate for a light-emitting element as defined in claim 4.

6. A reflective frame for a light-emitting element, which is formed to surround a mounting portion of a metal member on which a light-emitting element is mounted, and which is made of a sintered body comprising a glass material and a ceramic powder, wherein the glass material comprises, as based on oxides, from 15 to 45 mol % of $SiO_2$, from 0 to 10 mol % of $B_2O_3$, from 0 to 5 mol % of ZnO, from 15 to 30 mol % of $Li_eO+Na_2O+K_2O$, from 5 to 20 mol % of CaO, from 5 to 20 mol % of CaO+MgO+BaO+SrO, from 5 to 20 mol % of $TiO_2$ and from 0 to 10 mol % of $Al_2O_3$; and the sintered body is one fired at at most 900° C. and has a porosity of at most 15% and an average reflectance at a wave length of from 400 to 700 nm being at least 86% when the thickness is 1 mm.

7. The reflective frame for a light-emitting element according to claim 6, wherein the content of the ceramic powder is from 35 to 60 volume % in the total amount of the glass material and the ceramic powder.

8. The reflective frame for a light-emitting element according to claim 6, wherein the ceramic powder is alumina powder, zirconia powder or a mixture thereof.

9. A substrate for a light-emitting element, comprising a metal member on which a light-emitting element is mounted, and a reflective frame for a light-emitting element formed to surround a mounting portion of the metal member on which a light-emitting element is mounted, wherein the reflective frame for a light-emitting element is the reflective frame for a light-emitting element as defined in claim 6.

10. A light-emitting device comprising a light-emitting element and a substrate for a light-emitting element, on which the light-emitting element is mounted, wherein the substrate for a light-emitting element is the substrate for a light-emitting element as defined in claim 9.

* * * * *